US012299359B1

(12) United States Patent
Semple

(10) Patent No.: US 12,299,359 B1
(45) Date of Patent: May 13, 2025

(54) SYSTEM FOR IDENTIFYING SIMULATION SCENARIOS

(71) Applicant: Zoox, Inc., Foster City, CA (US)

(72) Inventor: Tod Cameron Semple, Woodside, CA (US)

(73) Assignee: Zoox, Inc., Foster City, CA (US)

( * ) Notice: Subject to any disclaimer, the term of this patent is extended or adjusted under 35 U.S.C. 154(b) by 1037 days.

(21) Appl. No.: 17/302,342

(22) Filed: Apr. 30, 2021

(51) Int. Cl.
*G06F 30/20* (2020.01)
*G07C 5/00* (2006.01)
*G07C 5/08* (2006.01)
*G01S 13/931* (2020.01)

(52) U.S. Cl.
CPC ............ *G06F 30/20* (2020.01); *G07C 5/008* (2013.01); *G07C 5/0816* (2013.01); *G01S 13/931* (2013.01)

(58) Field of Classification Search
CPC ....... G06F 30/20; G07C 5/008; G07C 5/0816; G01S 13/931
See application file for complete search history.

(56) References Cited

U.S. PATENT DOCUMENTS

| 2018/0157770 A1* | 6/2018 | Kim ..................... G06F 30/20 |
| 2018/0267538 A1* | 9/2018 | Shum .................... B60W 30/09 |
| 2020/0050536 A1* | 2/2020 | Nygaard ............. G06F 11/3684 |
| 2022/0198107 A1* | 6/2022 | Pedersen ............ G06F 11/3696 |

* cited by examiner

*Primary Examiner* — Kibrom K Gebresilassie
(74) *Attorney, Agent, or Firm* — Lee & Hayes, P.C.

(57) ABSTRACT

Techniques associated with categorizing simulation instances associated with simulation testing comprise categorizing simulation instances that produce unique or otherwise interesting results for further testing, review, and validation. In some cases, the system may be configured to determine low period of resource consumption and to schedule simulation testing during those periods of time.

20 Claims, 6 Drawing Sheets

SYSTEM FOR IDENTIFYING SIMULATION SCENARIOS

BACKGROUND

Autonomous vehicles are becoming more and more common. These vehicles may define and navigate along routes without the assistance of a human driver. Various systems have been developed to assist with testing, updating, and maintaining operational software and hardware of the autonomous vehicles to ensure safety and reliability prior to deployment of the vehicles. However, the testing software often produces large amounts of result data that is difficult for a human to parse and review.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
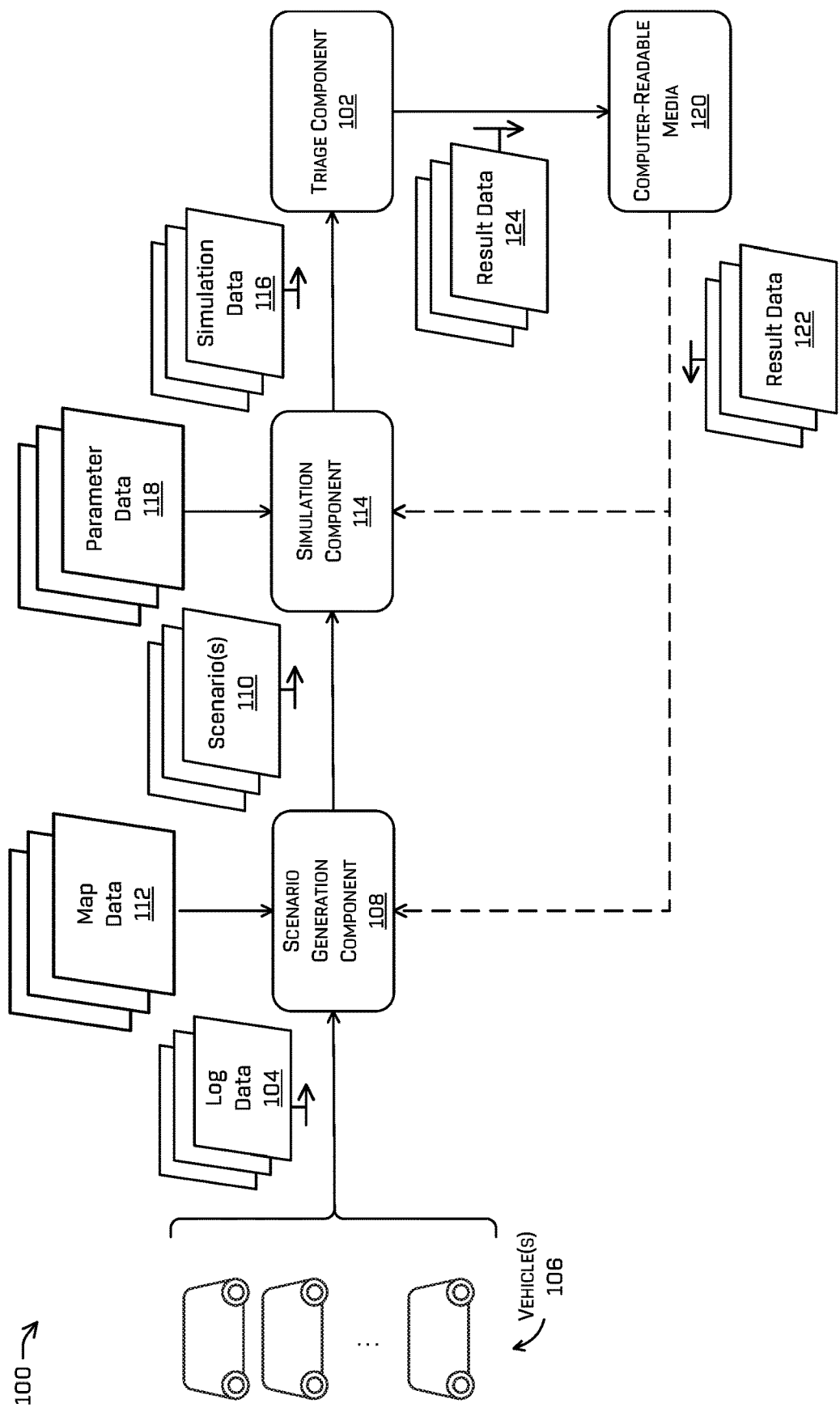
FIG. 1 illustrates an example block-diagram illustrating an example architecture of a scenario generation and simulation system including a triage component, in accordance with implementations of the disclosure.

Autonomous vehicles may navigate through physical environments along planned routes or paths. For example, when an autonomous vehicle receives a request to travel to a destination location, the autonomous vehicle may navigate along a planned path from the current location of the autonomous vehicle to a pickup location to pick up a passenger and then from the pickup location to the destination location. While navigating, the autonomous vehicle may encounter dynamic (e.g., vehicles, pedestrians, animals, and the like) and/or static (e.g., buildings, signage, parked vehicles, and the like) objects in the environment. In order to ensure the safety of the occupants and objects, the decisions and reactions of the autonomous vehicles to events and situations that the vehicle may encounter can be modeled and simulated using a plurality of scenarios defined and output by a scenario generation system and executed by a scenario simulation system. The results of the scenario simulation system may be analyzed to identify and/or flag specific scenarios for additional testing or modeling via the scenario simulation system, as an input to the scenario generation system, and/or for human review. The simulated scenario(s) may be used to verify an efficacy of an autonomous vehicle controller.

This application relates to a system for triaging simulation instances in order to identify unique or interesting results for further human analysis, testing, for use in training one or more machine learned models, etc. For example, for each scenario generated by the scenario generation system, the simulation system may run thousands to millions of simulations/instances (each having a set of results) using various seed data or parameters (such as agent position, types, characteristics, and the like). In general, may simulation instances may process and complete as expected, but in some cases, a certain simulation instance may produce unique or otherwise interesting results that may require further analysis and review (e.g., by a human). However, due to the large number of simulations and scenarios, identifying the simulation instances that produced the unique or interesting results may be difficult. Accordingly, described herein, are techniques directed to various aspects of identifying and flagging scenario and/or simulation instances that generate unique or otherwise interesting results. In some instances, techniques described herein may be performed when computing resources would otherwise be idle or underutilized. In this way, the techniques described herein may be used to simulate large numbers of scenarios without burdening computing resources during periods of higher utilization.

In some cases, the unique or interesting scenarios may represent instances in which a materiality of the simulation instance meets or exceeds a materiality threshold. For example, the materiality threshold may comprise instances that represent unexpected results produced by and/or potential errors in drive or operational systems of the vehicle, potential errors in the scenario generation system and/or the simulation system, or unexpected encounters with respect to the vehicle and one or more environmental conditions (e.g., such as an unexpected combination of conditions). For example, the materiality threshold may also include simulation instances in which a planner or other system faults, errors, or checks, simulation instances in which the vehicle entered a no-go or halted operation state (such as when a safety system triggered), simulation instances in which the vehicle exited a drivable portion of the road (such as when a road monitor system triggered), simulation instances in which the collision avoidance system is engaged, simulation instances in which a adverse event occurred, or other conditions such as meeting or exceeding an execution time threshold. In some cases, the triage system may assign a category to a simulation instance and/or a scenario in response to one or more adverse event metrics exceeding and/or meeting an event threshold. For example, details of surrogate safety metrics associated with an autonomous vehicle are discussed in U.S. application Ser. No. 17/210,101, which are herein incorporated by reference in their entirety for all purposes. Surrogate safety metrics are examples of metrics that can be tracking in simulation. If a value of one or more safety metrics meets a threshold, for example, an instance of a simulation can be selected for future review as disclosed herein.

In some implementations, the triage system may categorize each simulation instance based on the simulation results into two or more categories. For instance, in one specific example, the triage system may categorize the simulation instances into a high priority category, a review category, and a low priority category. In this specific example, the triage system may assign simulation instances to the high priority when the triage system detected a fault, error, or check with regards to the vehicle systems and/or simulation systems and/or an adverse event (e.g., contact between vehicles/objects) occurred at the fault of the autonomous vehicle. The triage system may assign a simulation instance to the review category when the triage system detects the vehicle exited the drivable portion of the road but no adverse event occurred or when the collision avoidance system engaged but no adverse event occurred, or an adverse event occurred but was the fault of a third party agent or actor. The remaining simulation instances may be assigned to the low priority category and, in some instances, the results may be discarded. As another illustrative example, the triage system may assign simulation instances that did not complete as expected to the high priority category, simulation instances that completed but encountered unexpected system operations to the review category, and simulation instances that completed safely and as expected (e.g., within thresholds of operation) to the low priority category.

In some examples, the simulation instances categorized as high priority and/or review priority may then be rerun by the simulation system to confirm the results, used as an input to the scenario generation system to further explore the potential issues, use to train a machine learned model, and/or stored or sent to a location accessible to a user for human review. The triage system may also store the simulation instances categorized as high priority and review priority at a location accessible by a user device for a user or operator of the system to reviewed manually. In some cases, the triage system may also send an alert or notification to a user device to inform the user or operator that a high priority or review priority simulation instance was detected, the reason the instance was flagged, in addition to other data associated with the simulation (such as conditions, seed data, scenario, and the like).

In other instances, as a non-limiting example for illustration, the triage system may categorize a simulation instance as high priority or review priority in response to the vehicle deviation by more than a threshold amount from a planned route, the vehicle exceeding a given acceleration or velocity, the simulation instance exceeding a time threshold (e.g., the vehicle did not reach the destination in a threshold period of time determined based on the route), the vehicle halting for more than a predetermined period of time, the vehicle exceeding a given deceleration, the vehicle preforming more than a threshold number of lane changes, and the like. In some cases, the triage system criteria may be adjusted or otherwise input by a user on, for instance, a per scenario basis.

In some cases, the simulation system may be configured to determine a current computing resource usage metric and to deploy the scenario generation, simulated testing, and triage system based at least in part on the sage metric and the available unused computing resources. For example, company computing resources may be underutilized during nighttime hours. In this example, the simulation system may check the current computer resource usage level at various periods of time, such as periodically thought the day/night or at predetermined times. The simulation system may then, based on the current computing resource usage metric, available resources, and historical time based computing resource usage data, determine a simulation size and run time. In this manner, the simulation system is able to more effectively utilize computing resources, avoids interrupting or consuming computing resources when desired by a user or operator, and reduces overall human review time, as discussed above. In addition to high levels of computer utilization, the system discussed herein, allows for the ability to generate more simulation scenarios, more simulation instances, and obtaining better, more material simulation results that result in increasing safety of the autonomous vehicles and more usable data for training machine learned models and/or networks.

Although examples are described in the context of autonomous vehicles, the techniques described herein are not limited to use with autonomous vehicles and may be used to generate and identify simulations for use with other scenarios, such as other types of vehicles (e.g., autonomous, semi-autonomous, or manually driven land vehicles, watercraft, aircraft, spacecraft, etc.), automated manufacturing, video games, etc.

FIG. 1 is an example block-diagram illustrating an example architecture of a scenario generation and simulation system 100 including a triage component 102, in accordance with implementations of the disclosure. As discussed above, synthetic scenario generation for use with simulation, modeling, and testing autonomous vehicles systems and software may assist with improving overall operations of the autonomous vehicles when encountering new or unexpected situations. In the current example, log data 104 may be received from one or more vehicles 106 operating on various roadways in real world conditions and environments. As discussed above the log data 104 may include sensor data, perception data, prediction data, trajectory information, and the like.

The log data 104 may be processed by a scenario generation component 108, which may output scenarios 110 based on the log data 104 as well as map data 112. In some cases, the scenario generation component 108 may be configured to parse log data 104 received from one or more vehicles 106 based on a set time interval (e.g., every 40 milliseconds, every 80 milliseconds, every 200 milliseconds, etc.). For each time interval, the scenario generation component 108 may define regions, actors or objects, parameters of the actors or objects (e.g., speed, trajectory, initial position, etc.), and the like.

In some examples, the scenario generation component 108 may utilize parameters or states of objects extracted from the log data 104 to generate the simulation scenarios 110. In some examples, the scenario generation component 108 may be configured to receive as an input or otherwise access the map data 112 of actual roads and physical environment. The scenario generation component 108 may then fit the scenarios 110 and/or arranged representative objects based on corresponding parameters (velocity, distance from the vehicle, associated region, direction of travel or trajectory, etc.) to the map data 112, such that the scenario 110 are determined feasible at the selected map location or environment. In other examples, the scenario generation component 108 may generate the scenarios 110 without relying on log data 104. For example, the scenarios and/or parameters of the scenarios may be generated as synthetically. In some cases, the scenarios 110 (either based at least in part on the logo data 104 and/or generated synthetically) may be fit to the map data 112, such that in some cases some scenarios 110 may be generated without relying on either the log data 104 or the map data 112.

A simulation component 114 may receive or access the scenarios 110 in order to generate and execute simulations of various components and software of autonomous vehicles in order to capture or generate simulation data 116. For example, the simulation data 116 may be generated based at least in part on the simulation component 114 executing various simulations using varying or different parameter data 118. For example, the simulation component 114 may vary the velocity, trajectory, initial position of various objects or agents within one or more of the scenarios 110. The simulation component 114 may output or otherwise generate simulation data 116. The simulation data 116 may include the results of individual simulation instances as well as various flags related to the occurrence of particular events, such as an activation of the collision avoidance system.

As an example, details associated with the scenario generation component 108 and the simulation component 114 may be discussed in U.S. application Ser. Nos. 16/866,715, 16/586,838, and 16/586,853, which are herein incorporated by reference in their entirety for all purposes. The simulation data 116 may be received and parsed by the triage component 102. For example, the simulation component 114 may execute thousands to millions of simulation instances corresponding to a plurality of scenarios 110. In general, a large majority of the simulation instances and the corresponding simulation data 116 may indicate that the vehicle executed the planned trajectory and reached the destination as expected. These simulation instances may not be interesting for determining changes or shortfalls of a simulated autonomous vehicle modeled in the scenario as the autonomous vehicle operated without incident. In these simulation instances, the systems of the vehicle and the simulation component executed correctly and the corresponding simulation data 116 may not require further investigation and/or validation. However, parsing the large amount of simulation data 116 for each scenario can be a time-consuming process. The triage component 102, discussed herein, may be configured to parse the simulation data 116 to identify simulation instances and/or scenarios 110 that had unexpected, unique results, or otherwise interesting results, store the results, and flag these simulation and the corresponding simulation data 116 for further review and/or testing. For example, the triage component 102 may identify simulation instances and/or scenarios 110 in which the situation data 116 comprises results in which a planner or other vehicle system experienced a fault, error, or check condition, the vehicle entered a no-go or halted operation state (such as an safety system triggered), the vehicle exited a drivable portion of the road (such as a road monitor system triggered), the collision avoidance system is engaged, an adverse event occurred, and the like.

In some implementations, the triage component 102 may categorize each simulation instance and/or scenario 110 based on the simulation data 116 into two or more categories. For instance, in some examples, the triage component 102 may categorize the simulation instances and/or scenario 110 into a high priority category, a review category, and a low priority category. In these examples, the triage component 102 may assign simulation instances and/or scenario 110 to the high priority (e.g., a top-level priority category) in response to detecting a fault, error, or check with regards to the vehicle autonomous driving or other systems and/or simulation systems. In certain examples, the simulated vehicle can include several simulated components (e.g., a planner, perception or other component related to autonomous vehicles). These components may be simulated to act according to a corresponding component of a physical autonomous vehicle. These components may self-identify errors or issues in the simulation when, for example, an unexpected scenario or event is encountered. If so, the triage component 102 may classify these vents as a top-level priority event for use in improving functionality of the corresponding autonomous vehicle controller. The triage component 102 may also categorize a simulation instance and/or scenario 110 as high priority in response to an adverse event that was deemed the fault of the autonomous vehicle.

The triage component 102 may assign a simulation instance and/or scenario 110 to the review category (e.g., a mid-level priority category) when, for example, the triage component 102 detects the vehicle exited the drivable portion of the road but no adverse event occurred, such as when a road monitor systems triggered or engaged. In other cases, the triage component 102 may categorize a simulation instance and/or scenario 110 in the review category in response to detecting, in the corresponding simulation data 116, that the collision avoidance system engaged but no adverse event occurred, or an adverse event occurred but was the fault of a third party agent or was otherwise unavoidable (which may be determined using machine-learned or rules-based automated techniques).

The triage component 102 may assign the remaining simulation instances and/or scenario 110 to the low priority category (e.g., a low-level priority or no priority category). As another illustrative example, the triage component 102 may assign simulation instances and/or scenario 110 in which the corresponding simulation data 116 indicates that the simulation completed safely and/or as expected to the low priority category.

In other examples, the triage system 102 may categorize a simulation instance and/or scenario 110 responsive to other monitors active or engaged, the vehicle changed lanes, a number of lane changes exceeds or meets a lane change threshold or metric, one or more adverse event metrics exceeding and/or meeting an event threshold, a deceleration of equal to or generate than a declaration threshold or metric, the simulation instance exceeding or meeting a time threshold, the vehicle failing to perform operations or take action for greater than or equal to a performance threshold, the vehicle exceeding a speed limit or other failures to comply with the rules of the road, and the like.

In examples, the triage component 102 may store the high priority and/or review priority simulation instances and/or scenarios 110 as well as the corresponding simulation data 116 at a location accessible to an operator or user, such as in a computer-readable media 120, as result data 122. In some cases, the triage component 102 may also send an alert or notification to a device associated with the operator or user to notify the operator or user that at least one simulation instance and/or scenario 110 was flagged for further investigation and/or validation.

In examples, the triage component 102 may also cause the scenario generating component 108 to generate additional scenarios 110 based on the high priority and/or review priority simulation instances. For instance, the scenario generating component 108 may receive the result data 122 and generate additional scenarios 110 that are likely to encounter similar results when tested by the simulation component 114. The triage component 102 may also cause the simulation components 114 to run additional simulation instances that are similar to the instances flagged as high priority and/or review priority. For instance, portions of the result data 122 may be used as parameters for the simulation component 114. In some specific examples, the simulation component 114 may perturb (such as via random noise, rotations, or use of anonymization models, or the like) or otherwise modify the parameters used in the flagged instance to attempt to replicate the corresponding simulation data 116.

By generating additional similar scenarios and/or testing additional simulation instances, the simulation system 100 and/or the triage component 102 may provide additional result data 122 and/or verification/validation of any potential fault, error, or issue prior to a review by an operator or user, thereby, further reducing time and expense associated with investigating and validating vehicle and/or simulation systems.

Figure 2:
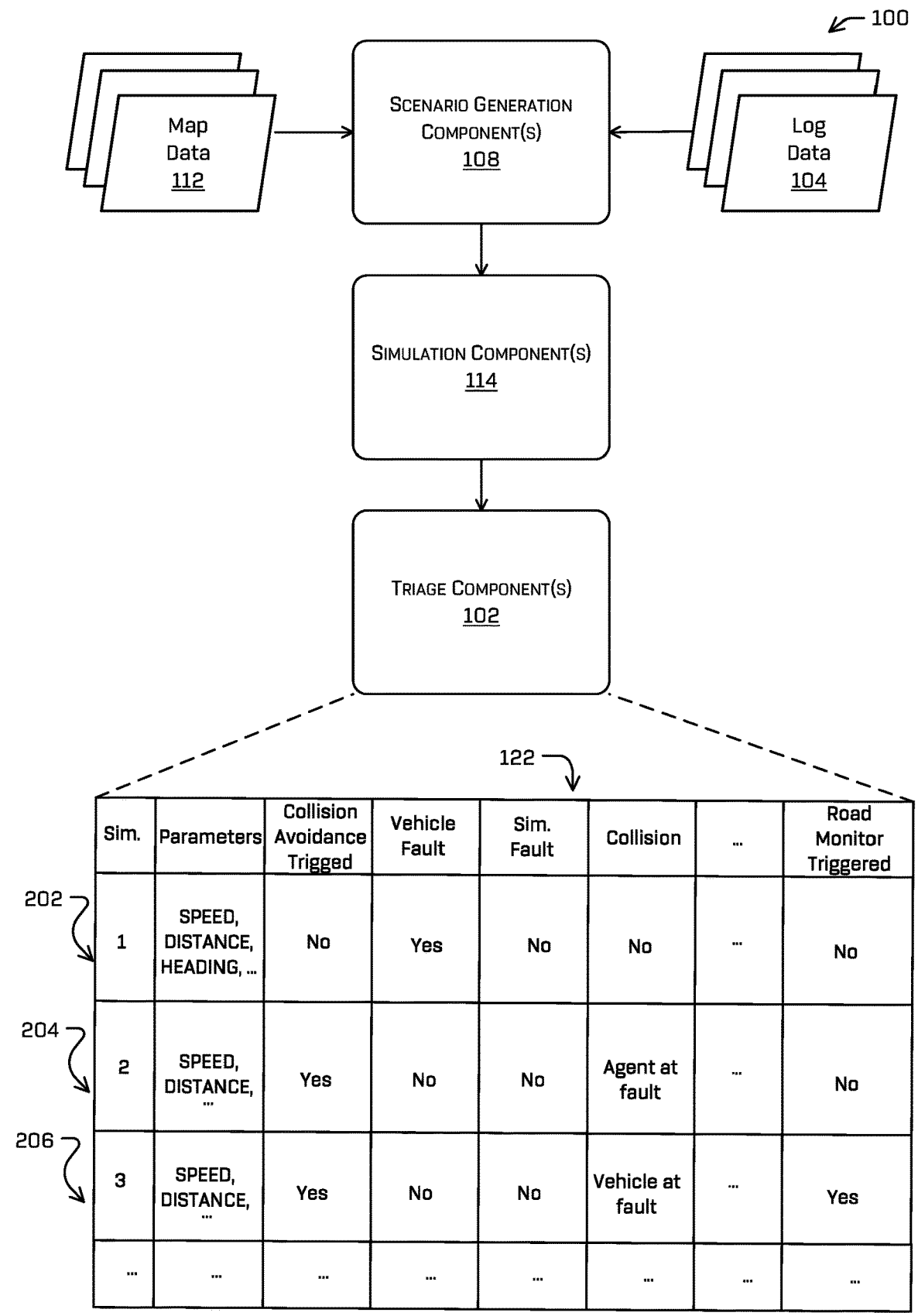
FIG. 2 illustrates another example block-diagram illustrating an example architecture of a scenario generation and simulation system including a triage component, in accordance with implementations of the disclosure.

FIG. 2 illustrates another example block-diagram illustrating an example architecture of a scenario generation and simulation system 100 including a triage component 102, in accordance with implementations of the disclosure. As discussed above with respect to FIG. 1, the simulation system 100 may include a scenario generation component 108 that may generate one or more scenarios for testing via simulation by a simulation component 114. In some cases, the scenarios are generated based at least in part on log data 104 and/or map data 112, while in other cases the scenarios may be generated without the assistance or input of the log data 104 and/or the map data 112 (such as when a synthetic scenario not yet encountered by an vehicle is being tested).

The simulation data from the simulation component 114 is analyzed and/or processed by the triage component 102. The triage component 102 may generate result data 122. The result data 122 may comprise a list of flagged simulation instances, such as instances 202, 204, and 206. The instances 202-206 may be organized in a table, array, or other manner and comprise data such as the parameters used by the simulation component 114 as well as multiple flags or bits. For instance, as non-limiting examples, the result data 122 may comprise entries, bits, and/or flags such as collision avoidance trigged, detected vehicle system fault, detected simulation system fault, adverse event occurrence, road monitored trigged, and the like. in some cases, such as the adverse event occurred entry, the field may include additional data such as who the simulation component 114 and/or the triage component 102 deemed was at fault.

In certain examples, a common feature of high priority simulations may be automatically detected or characterized using the disclosed techniques. For example, a number of high priority-flagged events associated with an unprotected left hand turn can be used to quantify the efficacy of an autonomous vehicle controller at performing unprotected left hand turn. Using this information, improvements to the autonomous vehicle controller can be quantifiably tracked and/or assessed. In some examples, flagged events can be analyzed to determine if a common simulation feature exists in certain categories of flagged simulation instances. For example, scenarios can be flagged as unprotected left-hand turn scenarios either through human flagging, machine flagging, etc. Such information may be used to identify a simulation or scenario that consistently causes an autonomous vehicle controller difficulty.

In some cases, the system may generate similar scenarios to a flagged simulation instance, to determine or quantify metrics associated with the occurrence of the flagged situation and the extent of the potential concern. For example, the scenario generation component 108 may receive a flagged scenario and/or simulation instance as an input and perturb various parameters of features of the scenario or simulation instance to generate similar situations or scenarios that may be tested by the simulation component 114. In other cases, the scenario generation component 108 may utilize a set of predefined rules to adjust the parameters and/or characteristics of the flagged scenario and/or simulation instance to generate the additional scenarios for further testing. For instance, in some examples, the scenario generation component 108 may move starting positions of objects, vary relative positions or distances, adjust speeds, velocities, acceleration and the like of the objects.

Figure 3:
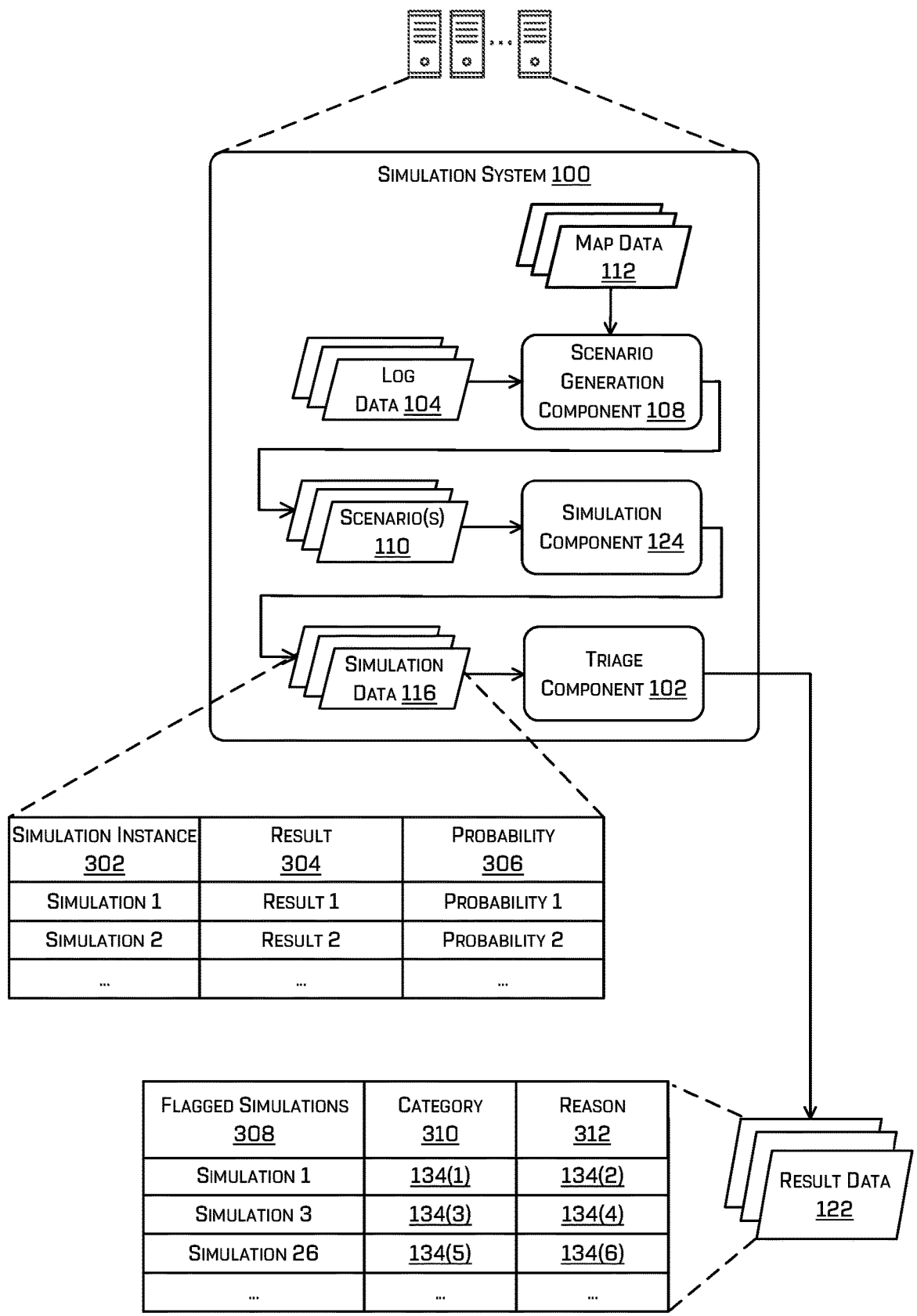
FIG. 3 illustrates another example block-diagram illustrating an example architecture of a scenario generation and simulation system including a triage component, in accordance with implementations of the disclosure.

FIG. 3 illustrates another example block-diagram illustrating an example architecture of a scenario generation and simulation system 100 including a triage component 102, in accordance with implementations of the disclosure. As discussed above with respect to FIG. 1, the simulation system 100 may include a scenario generation component 108 that may generate scenarios 110 for testing via simulation by a simulation component 114 based at least in part on log data 104 and/or map data 112.

The simulation data 116 may include a list of simulation instances 302, corresponding results 304, and, for instance, a probability 306 of encountering the scenario. For example, as described above, the simulation data 116 may indicate a pass or a fail based on rules/assertions that were broken/triggered. The simulation data 116 from the simulation component 114 is analyzed and/or processed by the triage component 102. The triage component 102 may generate result data 122. In this example, the result data 122 may comprise a list of flagged simulation instances 308, a category 310 (e.g., high priority or for review, and the like), and, in some cases, a reason 312 for the category 310, as shown.

Figure 4:
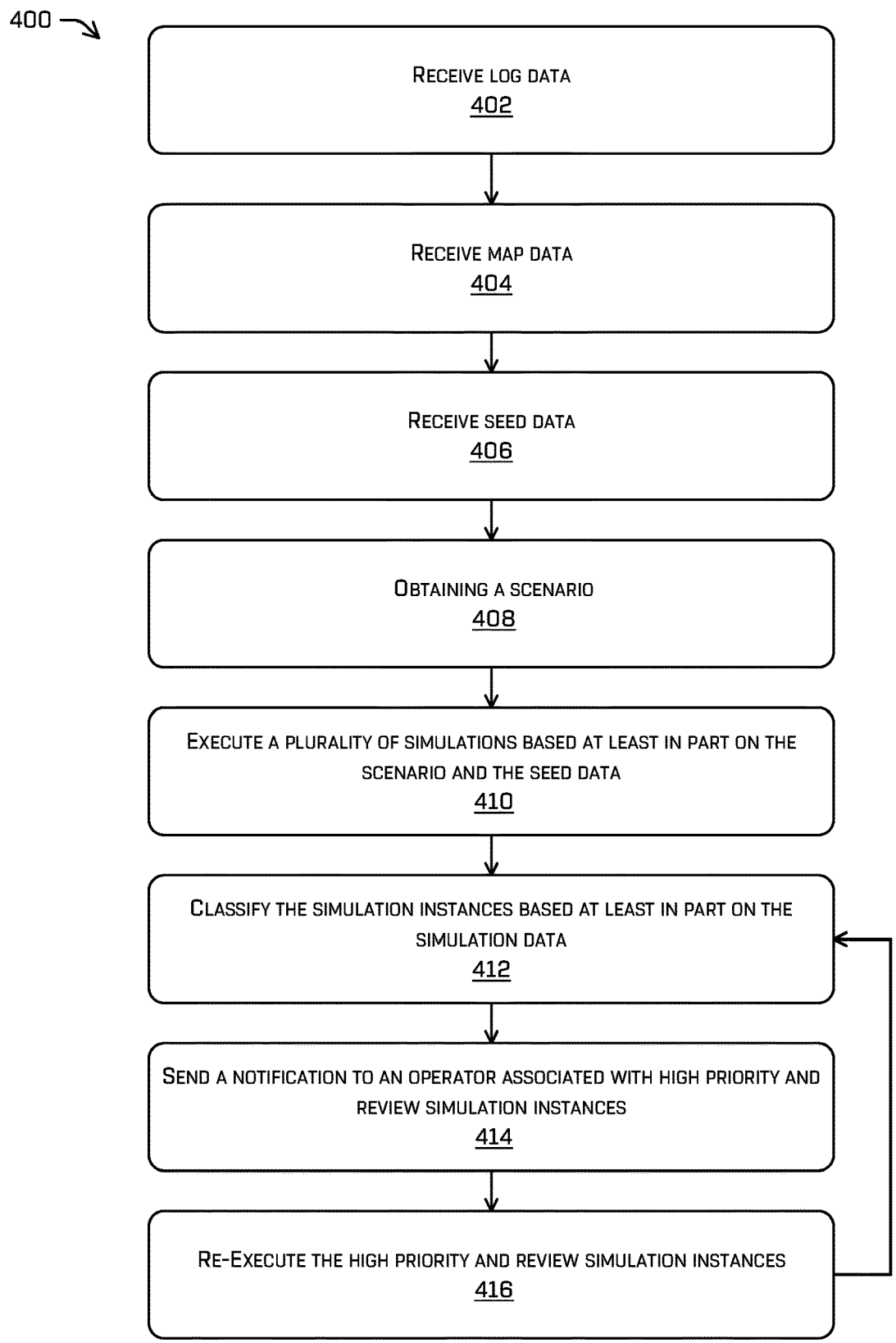
FIG. 4 is a flow diagram illustrating an example process associated with the triage component, in accordance with implementations of the disclosure.

FIG. 4 is a flow diagram illustrating example processes associated with the triage component discussed above. The processes are illustrated as a collection of blocks in a logical flow diagram, which represent a sequence of operations, some or all of which can be implemented in hardware, software, or a combination thereof. In the context of software, the blocks represent computer-executable instructions stored on one or more computer-readable media that, which when executed by one or more processors, perform the recited operations. Generally, computer-executable instructions include routines, programs, objects, components, encryption, deciphering, compressing, recording, data structures and the like that perform particular functions or implement particular abstract data types.

The order in which the operations are described should not be construed as a limitation. Any number of the described blocks can be combined in any order and/or in parallel to implement the processes, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 4 is a flow diagram illustrating an example process 400 associated with the triage component, in accordance with implementations of the disclosure. As discussed herein, a simulation system may generate and execute hundreds, thousand, or even millions of simulation instances, each having a set of results to be reviewed to obtain relevant information corresponding to a simulated autonomous vehicle, for example. Conventional systems may depend on a human review of the results of each simulation instance which can be expensive, time consuming, redundant, and result in unexamined instances. Therefore, as discussed herein, the simulation system may include a triage component, such as triage component 102 of FIGS. 1-3, to assist in identifying unexpected or unique simulation instances and/or results to more narrowly focus human review increasing accuracy of results garnered from the simulations and a reduction in time to review the results, thereby providing more efficient vehicle upgrades, fault detection, and the like as a result of simulated testing.

At 402, a simulation system may receive log data. For example, the log data may be received from one or more autonomous vehicles operating in physical world conditions. In other examples, the log data may be synthetic or otherwise generated from one or more systems that perturb or introduce randomness into vehicle's log data. In still other cases, the log data may be generated based on one or more machine learned models or networks.

At 404, the simulation system may receive map data. For example, the map data may be generated by one or more vehicle's operating in physical world conditions. In other cases, the map data may be obtained or access via one or more third party systems (such as government or private map services). The map data may be two-dimensional and/or three-dimensional in nature.

At 406, a simulation component of the simulation system may receive parameter data. For example, the parameter data may include a plurality of velocities, agents, trajectories, starting positions, and the like.

At 408, the simulation system may obtain a scenario. For example, a scenario generation component of the simulation system may generate a scenario, or the scenario may be received from another system. In some cases, the scenario generation system may generate the scenario based at least in part on the log data, the map data, and/or the seed data. For instance, the scenario generation system may extract or define actors or agents, parameters, situations, and/or operational conditions based on the log data. The scenario generation component may then utilize parameters or states of objects extracted from the log data to generate the scenarios. In some examples, the scenario generation component may be configured to receive as an input or otherwise access the map data and to fit the scenario data representative objects based on corresponding parameters (velocity, distance from the vehicle, associated region, direction of travel or trajectory, etc.) to the map data. For example, the fit may be determined based on a feasible metric at the selected map location or environment. In the current example, the process 400 illustrates generating scenarios using log data and/or map data, however, it should be understood that in some examples, the scenarios may be generated without the user of log data and/or map data, such as when the simulation system is testing conditions and/or environments not encountered by operating vehicles.

At 410, the simulation component executes a plurality of simulations based at least in part on the scenarios. For example, the simulation component may run multiple simulation instances representing different parameters with respect to individual scenarios. Each of the simulation instances may generate a corresponding set of simulation data, as discussed above. In some examples, the simulation data may include one or more flags, such as flags indicating that one or more systems were engaged or activated (e.g., collision avoidance system, road or lane monitoring systems, and the like), a total time of execution (e.g., how long it took the vehicle to complete the planned route), various metrics (e.g., number of lane changes, minimum and maximum velocity, minimum and maximum acceleration, minimum and maximum distances of other agents to the vehicle), any fault states of the vehicle or the simulation component, and the like.

At 412, a triage component of the simulation system may categorize the simulation instances based at least in part on the simulation data. For instance, the triage component may categorize the simulation instances into a high priority category, a review category, and a low priority category, as discussed above. In this specific example, the triage component may assign simulation instances to the high priority in response to the simulation data indicating a fault, error, or check with regards to the vehicle systems and/or simulation systems. The triage component may also assign simulation instances to the high priority in response to an occurrence of a adverse event. The triage component may assign a simulation instance to the review category when the simulation data indicates that the vehicle exited the drivable portion of the road (e.g., a road or lane monitoring system engaged) or the simulation instance met or exceed a simulation time threshold (e.g., the vehicle took longer than expected to reach the destination).

In some cases, the triage component may determine or estimate a fault of the adverse event using one or more machine learned models. In these cases, the triage component may categorize a particular simulation instance as high priority when the adverse event was at the fault of the autonomous vehicle. In some cases, when a adverse event occurs but the triage component deems the fault to be that of a third party agent (such as when a deer, pedestrian, or other object jumps in front of the vehicle in an unavoidable manner), the triage component may categorize the simulation instance as a for review but not as a high priority.

The triage component may assign the remaining simulation instances to the low priority category, as the remaining simulation instances completed within expected parameters and safely reached the destination within a determined time constraint.

At 414, the simulation system may send a notification associated with the high priority and review priority simulation instances to an operator. The notification may indicate a number of high priority and/or review priority simulation instances, a reason why each was categorized, and an indication of a location at which the instances and result data are stored. For example, the simulation system may store the result data and/or simulation instances at a location (such as a memory, server, or cloud-based location) accessible to one or more users or operators. In this manner, a human operator may review the result data and determine actions, if necessary, for further testing and/or updating the simulation or vehicle systems based at least in part on the results of the simulation instance.

At 416, the simulation system may re-execute the high priority and review simulation instances. For example, the scenario generating component may receive the high priority and/or review priority instances and corresponding result data and in response generate additional similar scenarios. For instance, the scenario generating component may receive the result data and generate additional scenarios that are likely to encounter similar conditions and situations and, thereby, generate similar results when tested by the simulation component over a set of parameters.

In other examples, the simulation components may re-execute the high priority and/or review priority instances as well as additional simulation instances (e.g., simulation instances with the same scenario and similar parameter data). For instance, portions of the result data may be used as parameters for the simulation component to re-execute the scenario. In some specific examples, the simulation component may perturb (such as via random noise, rotations, or use of anonymization models, or the like) or otherwise modify the parameter data used in the high priority and/or review priority instance to attempt to replicate the results.

It should be understood, that by generating additional similar scenarios and/or testing additional simulation instances, the simulation system and/or the triage component may provide additional result data and/or verification/ validation of any potential fault, error, or issue prior to human review by an operator or user, thereby, further reducing time and expense associated with investigating and validating vehicle and/or simulation systems.

Figure 5:
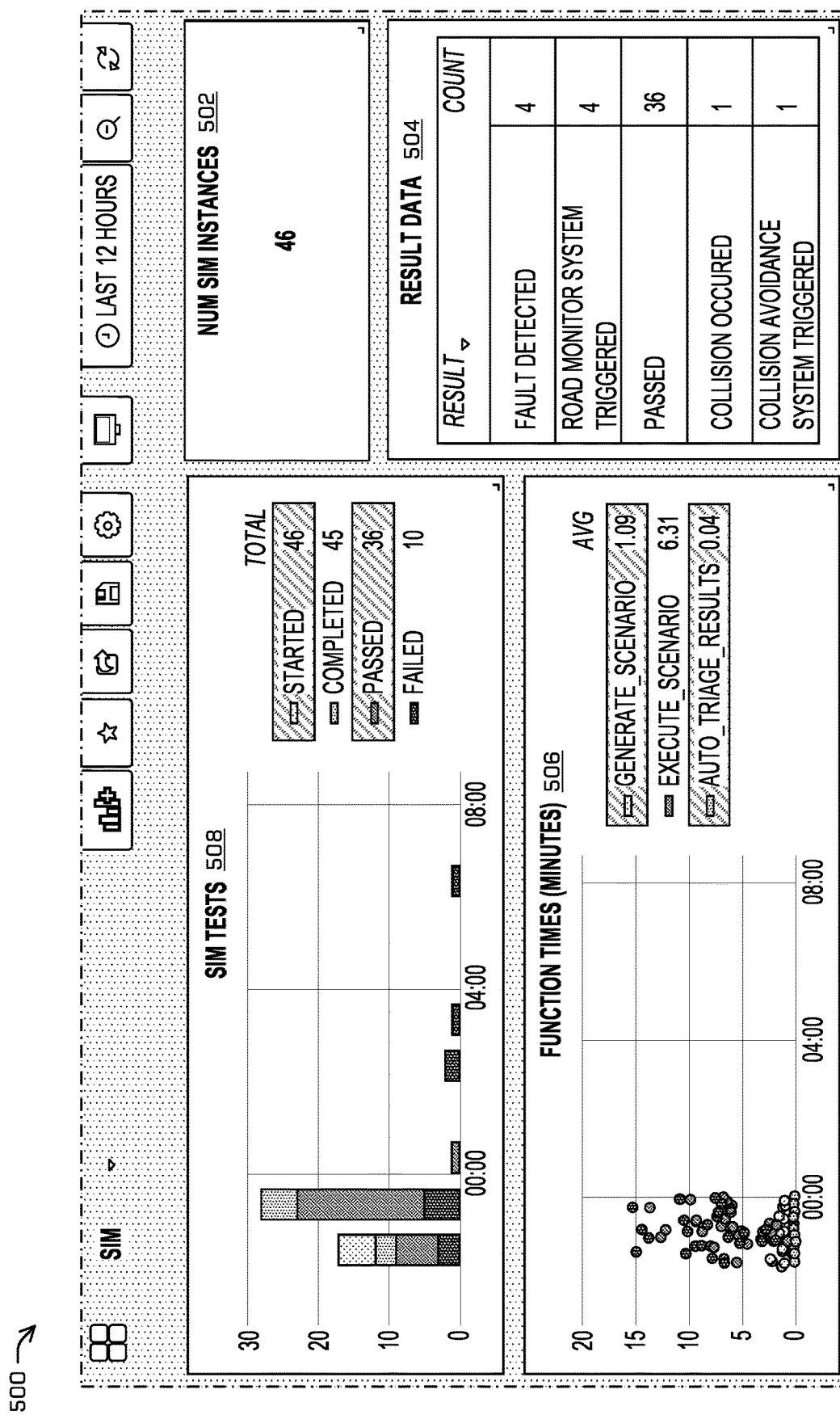
FIG. 5 is a pictorial diagram illustrating an example user interface for viewing results data associated with the triage component, in accordance with implementations of the disclosure.

FIG. 5 is a pictorial diagram illustrating example user interface 500 for viewing results data associated with the triage component, in accordance with implementations of the disclosure. In the current example, a user may be able to view the results of a simulation run associated with a scenario and multiple situation instances associated therewith. In the current example, the user interface 500 may display data associated with the number of tests, generally indicated by 502, as well as metrics associated with the results data, generally indicated by 504. For instance, in the current example, 46 simulation instances were executed, four of which encountered a failure event, four caused the road monitoring system to engage, and one caused the collision avoidance system to activate.

The user interface 500 may also provide metrics associated with the run time of each simulation instance, generally indicated by 506 as well as data associated with the number of completed instances, passed instances, failed instances, and started instances, generally indicated by 508. As illustrated, the user interface 500 may present the result data in various forms, such as charts, diagrams, text-based, or the like.

Figure 6:
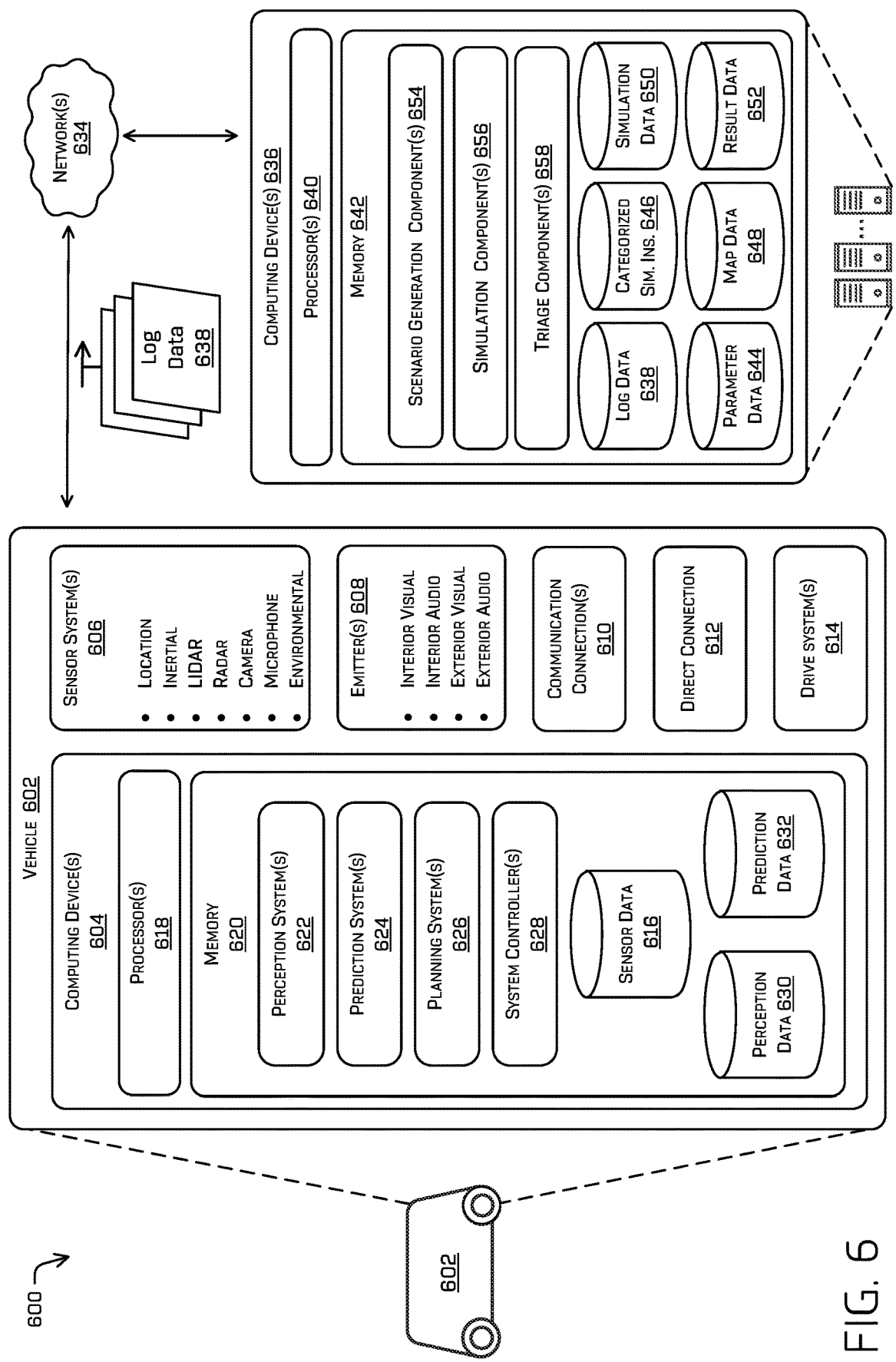
FIG. 6 depicts a block diagram of an example system for implementing the techniques discussed herein.

FIG. 6 depicts a block diagram of an example system 600 for implementing the techniques discussed herein. In at least one example, the system 600 may include a vehicle 602, such the autonomous vehicles discussed above. The vehicle 602 may include computing device(s) 604, one or more sensor system(s) 606, one or more emitter(s) 608, one or more communication connection(s) 610 (also referred to as communication devices and/or modems), at least one direct connection 612 (e.g., for physically coupling with the vehicle 602 to exchange data and/or to provide power), and one or more drive system(s) 614. The one or more sensor system(s) 606 may be configured to capture the sensor data 616 associated with a surrounding physical environment.

In at least some examples, the sensor system(s) 606 may include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. In some examples, the sensor system(s) 606 may include multiple instances of each type of sensors. For instance, time-of-flight sensors may include individual time-of-flight sensors located at the corners, front, back, sides, and/or top of the vehicle 602. As another example, camera sensors may include multiple cameras disposed at various locations about the exterior and/or interior of the vehicle 602. In some cases, the sensor system(s) 606 may provide input to the computing device(s) 604.

The vehicle 602 may also include one or more emitter(s) 608 for emitting light and/or sound. The one or more emitter(s) 608 in this example include interior audio and visual emitters to communicate with passengers of the vehicle 602. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 608 in this example also includes exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle 602 can also include one or more communication connection(s) 610 that enables communication between the vehicle 602 and one or more other local or remote computing device(s) (e.g., a remote teleoperations computing device) or remote services. For instance, the communication connection(s) 610 can facilitate communication with other local computing device(s) on the vehicle 602 and/or the drive system(s) 614. Also, the communication connection(s) 610 may allow the vehicle 602 to communicate with other nearby computing device(s) (e.g., other nearby vehicles, traffic signals, etc.).

The communications connection(s) 610 may include physical and/or logical interfaces for connecting the computing device(s) 604 to another computing device or one or more external network(s) 634 (e.g., the Internet). For example, the communications connection(s) 610 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s). In at least some examples, the communication connection(s) 610 may comprise the one or more modems as described in detail above.

In at least one example, the vehicle 602 may include one or more drive system(s) 614. In some examples, the vehicle 602 may have a single drive system 614. In at least one example, if the vehicle 602 has multiple drive systems 614, individual drive systems 614 may be positioned on opposite ends of the vehicle 602 (e.g., the front and the rear, etc.). In at least one example, the drive system(s) 614 can include one or more sensor system(s) 606 to detect conditions of the drive system(s) 614 and/or the surroundings of the vehicle 602. By way of example and not limitation, the sensor system(s) 606 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders may be unique to the drive system(s) 614. In some cases, the sensor system(s) 606 on the drive system(s) 614 can overlap or supplement corresponding systems of the vehicle 602 (e.g., sensor system(s) 606).

The drive system(s) 614 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 614 can include a drive system controller which may receive and preprocess data from the sensor system(s) 606 and to control operation of the various vehicle systems. In some examples, the drive system controller can include one or more processor(s) and memory communicatively coupled with the one or more processor(s). The memory can store one or more modules to perform various functionalities of the drive system(s) 614. Furthermore, the drive system(s) 614 also include one or more communication connection(s) that enable communication by the respective drive system with one or more other local or remote computing device(s).

The computing device(s) 604 may include one or more processors 618 and one or more memories 620 communicatively coupled with the processor(s) 618. In the illustrated example, the memory 620 of the computing device(s) 604 stores perception system(s) 622, prediction system(s) 624, planning system(s) 626, as well as one or more system controller(s) 628. The memory 620 may also store data such as sensor data 616 captured or collected by the one or more sensors systems 606, perception data 630 associated with the processed (e.g., categorized and segmented) sensor data 616, prediction data 632 associated with one or more predicted state of the environment and/or detected objects within the environment. Though depicted as residing in the memory 620 for illustrative purposes, it is contemplated that the perception system(s) 622, prediction system(s) 624, planning system(s) 626, as well as one or more system controller(s) 628 may additionally, or alternatively, be accessible to the computing device(s) 604 (e.g., stored in a different component of vehicle 602 and/or be accessible to the vehicle 602 (e.g., stored remotely).

The perception system 622 may be configured to perform object detection, segmentation, and/or category on the sensor data 616. In some examples, the perception system 622 may generate processed perception data 630 from the sensor data 616. The perception data 630 may indicate a presence of objects that are in physical proximity to the vehicle 602 and/or a classification or type of the objects (e.g., car, pedestrian, cyclist, building, tree, road surface, curb, sidewalk, unknown, etc.). In additional and/or alternative examples, the perception system 622 may generate or identify one or more characteristics associated with the objects and/or the physical environment. In some examples, characteristics associated with the objects may include, but are not limited to, an x-position, a y-position, a z-position, an orientation, a type (e.g., a classification), a velocity, a size, a direction of travel, etc. Characteristics associated with the environment may include, but are not limited to, a presence of another object, a time of day, a weather condition, a geographic position, an indication of darkness/light, etc. For example, details of classification and/or segmentation associated with a perception system are discussed in U.S. application Ser. No. 15/820,245, which are herein incorporated by reference in their entirety for all purposes.

The prediction system 624 may be configured to determine a track corresponding to an object identified by the perception system 622. For example, the prediction system 624 may be configured to predict a velocity, position, change in trajectory, or otherwise predict the decisions and movement of the identified objects. For example, the prediction system 624 may include one or more machine learned models that may, based on inputs such as object type or classification and object characteristics, output predicted characteristics of the object at one or more future points in time. For example, details of predictions systems are discussed in U.S. application Ser. Nos. 16/246,208 and 16/420, 050, which are herein incorporated by reference in their entirety for all purposes.

The planning system 626 may be configured to determine a route for the vehicle 602 to follow to traverse through an environment. For example, the planning system 626 may determine various routes and paths and various levels of detail based at least in part on the objects detected, the predicted characteristics of the object at future times, and a set of safety requirements corresponding to the current scenario (e.g., combination of objects detected and/or environmental conditions). In some instances, the planning system 626 may determine a route to travel from a first location (e.g., a current location) to a second location (e.g., a target location) in order to avoid an object obstructing or blocking a planned path of the vehicle 602. In some case, a route can be a sequence of waypoints for traveling between the two locations (e.g., the first location and the second location). In some cases, waypoints include streets, intersections, global positioning system (GPS) coordinates, etc. For example, details of path and route planning by the planning system are discussed in U.S. application Ser. Nos. 16/805,118 and 15/632,208, which are each herein incorporated by reference, in its entirety and for all purposes.

In at least one example, the computing device(s) 604 may store one or more and/or system controllers 628, which may be configured to control steering, propulsion, braking, safety, emitters, communication, and other systems of the vehicle 602. The system controllers 628 may communicate with and/or control corresponding systems of the drive system(s) 614 and/or other components of the vehicle 602, which may be configured to operate in accordance with a route provided from the planning system 626.

In some implementations, the vehicle 602 may connect to computing device(s) 636 via the network(s) 634. For example, the computing device(s) 636 may receive log data 638 from one or more vehicles 602. The log data 638 may include the sensor data 616, perception data 630, prediction data 632 and/or a combination thereof. In some cases, the log data 638 may include portion of one or more of the sensor data 616, perception data 630, prediction data 632.

The computing device 636 may include one or more processors 640 and memory 642 communicatively coupled with the one or more processors 640. In at least one instance, the processor(s) 640 may be similar to the processor(s) 618 and the memory 642 may be similar to the memory 620. In the illustrated example, the memory 642 of the computing device(s) 636 stores the log data 638 received from one or more vehicles 602. The memory 642 may also store parameter data 644, categorized simulation instances 646, map data 648, simulation data 650, and results data 652, as described above. The memory 642 may also store a scenario generation component 654, simulation component 656, and triage component 658.

The scenario generation component 654 may be configured to parse log data 638 received from one or more vehicles 602 and define a set of regions surrounding the vehicle 602. In some cases, the regions may be defined based on lanes, designations within the environment, and relative to the position of the vehicle capturing the sensor data and generating the log data 638. In some implementations, the scenario generation component 654 may determine or sample an existence of objects or agents within each of the defined or discrete regions. For example, one or more objects may be present in each region. The scenario generation component 654 may then determine or identify a category or type associated with each object in each region. The scenario generation component 654 may then select or determine a representative object or agents within each region.

The scenario generation component 654 may then generate scenarios using the extracted data, discussed above. In some examples, the scenario generation component 654 may be configured to receive as an input or otherwise access map data 648 of actual roads and physical environment. The scenario generation component 654 may then fit the extracted data and/or arranged representative objects or agents associated with the extracted data to the map data 648, such that each scenario is physical feasible or possible at the selected map location or environment.

A simulation component 656 may receive or access the scenarios in order to generate and execute simulation instances of various components and software of autonomous vehicles in order to capture or collect simulation data 650. For example, the scenario data may be used by the simulation component 656 to simulate variations of the desired situation represented by the scenario criterion. For example, the simulation component 656 may execute a variation of the vectorized scenario data in a simulation for testing and validation. The simulation component 656 may also generate simulation data 650 indicating how the tested autonomous vehicle performed (e.g., responded) and may compare the simulation data 650 to a predetermined outcome and/or determine if any predetermined rules/assertions were broken/triggered.

The triage component 658 may be configured to receive and/or access the simulation data 650 and to generate a set of categorized simulation instances 646 and/or result data 652. For example, based on the simulation data 650 corresponding to each of the simulation instance executed by the simulation component 656, the triage component 658 may categorize the instance into one or more category. For example, in one specific instance, the triage component 658 may categorize each instance as high priority, review priority, or low priority.

As an illustrative example, the triage component 658 may assign simulation instances to the high priority in response to the simulation data indicating a fault, error, or check with regards to the vehicle systems and/or simulation systems. The triage component 658 may also assign simulation instances to the high priority in response to an occurrence of an adverse event. The triage component 658 may assign a simulation instance to the review category when the simulation data indicates that the vehicle exited the drivable portion of the road (e.g., a road or lane monitoring system engaged) or the simulation instance met or exceed a simulation time threshold (e.g., the vehicle took longer than expected to reach the destination).

In some cases, the triage component 658 may determine or estimate a fault of the adverse event using one or more machine learned models. In these cases, the triage component 658 may categorize a particular simulation instance as high priority when the adverse event was at the fault of the autonomous vehicle. In some cases, when an adverse event occurs but the triage component 658 deems the fault that of a third party agent (such as when a deer jumps in front of the vehicle in an unavoidable manner), the triage component 658 may categorize the simulation instance as for review but not as a high priority.

In other instances, as a non-limiting example for illustration, the triage component 658 may categorize a simulation instance as high priority or review priority in response to the vehicle deviation by more than a threshold amount from a planned route, the vehicle exceeding a given acceleration or velocity, the simulation instance exceeding a time threshold (e.g., the vehicle did not reach the destination in a threshold period of time determined based on the route), the vehicle halting for more than a predetermined period of time, the vehicle exceeding a given deceleration, the vehicle preforming more than a threshold number of lane changes, and the like. In some cases, the triage component 658 criteria may be adjusted or otherwise input by a user on, for instance, a per scenario basis.

The triage component 658 may assign the remaining simulation instances to the low priority category. For example, if the simulation instances completed within normal operating expectations or criterion, the corresponding simulation data 650 does not require further human review and, as such, the simulation data 650 may be discarded to preserve resources for other more unique results.

In some cases, the simulation system may be configured to determine a current computing resource usage metric associated with the computing devices 636, processors 640, and/or the memory 642 and to deploy the scenario generation component 654, the simulation component 656, and triage component 658 based at least in part on the usage metric and the available unused computing resources. For example, the computing devices 636 may be underutilized during nighttime hours. In this example, the simulation system may check the current computer resource usage level at various periods of time, such as periodically thought the day/night or at predetermined times. The simulation system may then, based on the current computing resource usage metric, available resources, and historical time based computing resource usage data, determine a simulation size and run time. In this manner, the simulation system is able to more effectively utilize computing resources, avoids interrupting or consuming computing resources when desired by a user or operator, and reduces overall human review time, as discussed above. In addition to high levels of computing device 636 utilization, the system discussed herein, allows for the ability to generate more simulation scenarios, more simulation instances, and obtaining better, more material simulation results that result in increasing safety of the autonomous vehicles 602 and more usable data for training machine learned models and/or networks.

The processor(s) 618 of the computing device(s) 604 and the processor(s) 640 of the computing device(s) 636 may be any suitable processor capable of executing instructions to process data and perform operations as described herein. By way of example and not limitation, the processor(s) 618 and 640 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 620 of the computing device(s) 604 and the memory 642 of the computing device(s) 636 are examples of non-transitory computer-readable media. The memory 620 and 642 can store an operating system and one or more software applications, instructions, programs, and/or data to implement the methods described herein and the functions attributed to the various systems. In various implementations, the memory 620 and 642 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine learning algorithms. For example, in some instances, the components in the memory 620 and 642 can be implemented as a neural network.

CONCLUSION

While one or more examples of the techniques described herein have been described, various alterations, additions, permutations and equivalents thereof are included within the scope of the techniques described herein. As can be understood, the components discussed herein are described as divided for illustrative purposes. However, the operations performed by the various components can be combined or performed in any other component. It should also be understood, that components or steps discussed with respect to one example or implementation may be used in conjunction with components or steps of other examples. For example, the components and instructions of FIG. 6 may utilize the processes and flows of FIGS. 1-5.

A non-limiting list of objects or agents may include obstacles in an environment, including but not limited to pedestrians, animals, cyclists, trucks, motorcycles, other vehicles, or the like. Such objects in the environment have a "geometric pose" (which may also be referred to herein as merely "pose") comprising a location and/or orientation of the overall object relative to a frame of reference. In some examples, pose may be indicative of a position of an object (e.g., pedestrian), an orientation of the object, or relative appendage positions of the object. Geometric pose may be described in two-dimensions (e.g., using an x-y coordinate system) or three-dimensions (e.g., using an x-y-z or polar coordinate system), and may include an orientation (e.g., roll, pitch, and/or yaw) of the object. Some objects, such as pedestrians and animals, also have what is referred to herein as "appearance pose." Appearance pose comprises a shape and/or positioning of parts of a body (e.g., appendages, head, torso, eyes, hands, feet, etc.). As used herein, the term "pose" refers to both the "geometric pose" of an object relative to a frame of reference and, in the case of pedestrians, animals, and other objects capable of changing shape and/or positioning of parts of a body, "appearance pose." In some examples, the frame of reference is described with reference to a two- or three-dimensional coordinate system or map that describes the location of objects relative to a vehicle. However, in other examples, other frames of reference may be used.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

EXAMPLE CLAUSES

A. An system comprising: one or more processors; and one or more non-transitory computer-readable media storing instructions that, when executed by the one or more processors, cause the one or more processors to perform operations comprising: receiving log data associated with a vehicle, the log data representing an environment traversed by the vehicle; receiving map data associated with a physical environment; generating a scenario based at least in part on the log data and the map data; generating a simulation data based at least in part on the scenario; assigning a first simulation instance associated with the simulation data to a first category based at least in part on the simulation data corresponding to the first simulation instance representing at least one of the following: an engagement of a collision avoidance system associated with the vehicle during the first simulation instance; an occurrence of a fault associated with operations of the vehicle during the first simulation instance; or an occurrence of a fault associated with execution of the first simulation instance; and storing the first simulation instance and the simulation data corresponding to the first simulation instance based at least in part on the first category.

B. The system of claim A, the operations further comprising: assigning a second simulation instance associated with the simulation data a second category based at least in part on the simulation data corresponding to the second simulation instance representing at least one of the following: an engagement of a monitoring system associated with the vehicle during the first simulation instance; a period of time associated with the simulation instances elapsing; or an adverse event metrics exceeding and/or meeting an event threshold; storing the second simulation instance and the simulation data corresponding to the second simulation instance based at least in part on the second category; assigning a third simulation instance associated with the simulation data a third category based at least in part on the simulation data corresponding to the third simulation instance; and discarding the third simulation instance based at least in part on the assignment to the third category; and wherein the first category is a high priority, the second category is a mid-level category, and the third category is a low priority.

C. The system of claim A, wherein the scenario is a first scenario, the simulation data is a first simulation data, and the operations further comprise: generating a second scenario based at least in part on the first simulation data; generating second simulation data based at least in part on the second scenario; assigning a second simulation instance to the first category based at least in part on the second simulation data corresponding to the second simulation instance; and storing the second simulation instance and the second simulation data corresponding to the second simulation instance.

D. The system of claim A, the operations further comprising: prior to generating the simulation data: identifying a window of time associated with the generation of the simulation data; determining that a current or planned load on a computing resource during the window of time is below a threshold; and scheduling the generation of the simulation data to be performed during the window of time.

E. A method comprising: obtaining scenario data, the scenario data representing one or more situations for simulated testing of systems associated with a simulated vehicle in the scenario; generating a plurality of simulation instances based at least in part on the scenario data; assigning a first simulation instance of the plurality of simulation instances to a first category based at least in part on first simulation data indicating that the first simulation meets or exceeds a threshold indicative of autonomous operation of the vehicle; and storing the first simulation instance and the first simulation data based at least in part on the first category.

F. The method of paragraph E, further comprising: receiving log data associated with the vehicle, the log data representing an environment traversed by the vehicle; receiving map data associated with physical environments; and wherein obtaining the scenario comprises generating the scenario based at least in part on the log data and the map data.

G. The method of paragraph E, wherein the threshold is associated with engagement of a collision avoidance system associated with the vehicle during the first simulation instance and assigning the first simulation instance to the first category is based at least in part on the engagement of the collision avoidance system.

H. The method of paragraph E, wherein the threshold is associated with an engagement of a road or lane monitoring system associated with the vehicle during the first simulation instance and assigning the first simulation instance to the first category is based at least in part on the engagement of the road or lane monitoring system.

I. The method of paragraph E, wherein the threshold is associated with an occurrence of a fault associated with operations of the vehicle during the first simulation instance and assigning the first simulation instance to the first category is based at least in part on the occurrence of the fault.

J. The method of paragraph E, wherein the threshold is associated with an occurrence of a fault associated with execution of the first simulation instance during the first simulation instance and assigning the first simulation instance to the first category is based at least in part on the occurrence of the fault.

K. The method of paragraph E, further comprising: assigning a second simulation instance of the plurality of simulation instances to a second category based at least in part on second simulation data corresponding to the second simulation instance; assigning a third simulation instance of the plurality of simulation instances to a third category based at least in part on second simulation data corresponding to the second simulation instance; and discarding the second simulation instance and the second simulation data based on the assignment to the second category; and wherein: the first simulation data is stored at a first location and the second simulation data is stored at a second location; and the first category is a high priority, the second category is a mid-level category, and the third category is a low priority.

L. The method of paragraph E, wherein the scenario is a first scenario, the plurality of simulation instances is a first plurality of simulation instances, and the method further comprises: generating second scenario data based at least in part on the first simulation data; generating a second plurality of simulation instances based at least in part on the second scenario data; assigning a second simulation instance of the second plurality of simulation instances to the first category based at least in part on second simulation data indicating that the second simulation meets or exceeds the threshold indicative of autonomous operation of the vehicle; and storing the second simulation instance and the second simulation data based at least in part on the first category.

M. The method of paragraph E, further comprising: determining that a current or planned load on a computing resource during a window of time is below a threshold; and scheduling the generation of the plurality of simulation instances to be performed during the window of time.

N. A non-transitory computer-readable medium storing instructions that, when executed, cause one or more processors to perform operations comprising: obtaining scenario data, the scenario data representing one or more situations for simulated testing of systems associated with a simulated vehicle in the scenario; generating a plurality of simulation instances based at least in part on the scenario data; assigning a first simulation instance of the plurality of simulation instances to a first category based at least in part on first simulation data indicating that the first simulation meets or exceeds a threshold indicative of autonomous operation of the vehicle; and storing the first simulation instance and the first simulation data based at least in part on the first category.

O. The non-transitory computer-readable medium of paragraph N, wherein the threshold indicative of autonomous operation of the vehicle comprises an occurrence of an adverse event associated with the first simulation instance and assigning the first simulation instance to the first category is based at least in part on the occurrence of the adverse event.

P. The non-transitory computer-readable medium of paragraph N, wherein assigning the first simulation instance to the first category is based at least in part on determining the occurrence of the adverse event is at a fault of the vehicle.

Q. The non-transitory computer-readable medium of paragraph N, wherein the first category is selected from a set of category comprising a high priority category, a review category and a low priority category.

R. The non-transitory computer-readable medium of paragraph N, wherein the scenario is a first scenario, the plurality of simulation instances is a first plurality of simulation instances, and wherein the operations further comprise: generating second scenario data based at least in part on the first simulation data; generating a second plurality of simulation instances based at least in part on the second scenario data; assigning a second simulation instance of the second plurality of simulation instances to the first category based at least in part on second simulation data indicating that the second simulation meets or exceeds the threshold indicative of autonomous operation of the vehicle; and storing the second simulation instance and the second simulation data based at least in part on the first category.

S. The non-transitory computer-readable medium of paragraph N, wherein the operations further comprise: determining that a current or planned load on a computing resource during a window of time is below a threshold; and scheduling the generation of the plurality of simulation instances to be performed during the window of time.

T. The non-transitory computer-readable medium of paragraph N, wherein the operations further comprise: assigning a second simulation instance of the plurality of simulation instances to a second category based at least in part on second simulation data corresponding to the second simulation instance; assigning a third simulation instance of the plurality of simulation instances to a third category based at least in part on second simulation data corresponding to the second simulation instance; and discarding the second simulation instance and the second simulation data based on the assignment to the second category; and wherein the first simulation data is stored at a first location and the second simulation data is stored at a second location.

While the example clauses described above are described with respect to one particular implementation, it should be understood that, in the context of this document, the content of the example clauses can also be implemented via a method, device, system, a computer-readable medium, and/or another implementation. Additionally, any of examples A-T may be implemented alone or in combination with any other one or more of the examples A-T.

What is claimed is:

1. A system comprising:
   one or more processors; and
   one or more non-transitory computer-readable media storing instructions that, when executed by the one or more processors, cause the one or more processors to perform operations comprising:
      receiving log data associated with a vehicle, the log data representing an environment traversed by the vehicle;
      generating a scenario based at least in part on altering one or more data of the log data;
      executing a plurality of simulation instances based at least in part on the scenario;
      generating simulation data comprising results of the executing the plurality of simulation instances;
      assigning a first simulation instance of the plurality of simulation instances to a first category based at least in part on the simulation data corresponding to the first simulation instance indicating at least one of:
         an engagement of a collision avoidance system associated with the vehicle during the first simulation instance;
         an occurrence of a fault associated with operations of the vehicle during the first simulation instance; or
         an occurrence of a fault associated with execution of the first simulation instance; and
      storing, at a first storage location, the first simulation instance and the simulation data corresponding to the first simulation instance based at least in part on the first simulation instance being assigned the first category.

2. The system as recited in claim 1, the operations further comprising:
   assigning a second simulation instance of the plurality of simulation instances to a second category based at least in part on the simulation data corresponding to the second simulation instance indicating at least one of:
      an engagement of a monitoring system associated with the vehicle during the second simulation instance;
      a period of time associated with individual simulation instances of the plurality of simulation instances elapsing; or
      an adverse event metrics exceeding and/or meeting an event threshold;
   storing, at a second storage location different from the first storage location, the second simulation instance and the simulation data corresponding to the second simulation instance based at least in part on the second category;
   assigning a third simulation instance of the plurality of simulation instances to a third category based at least in part on the simulation data corresponding to the third simulation instance; and
   discarding the third simulation instance based at least in part on the third simulation instance being assigned to the third category; and
   wherein the first category is a high priority, the second category is a mid-level category, and the third category is a low priority.

3. The system as recited in claim 1, wherein the scenario is a first scenario, the simulation data is a first simulation data, and the operations further comprise:
   generating a second scenario based at least in part on the first simulation data;
   generating second simulation data based at least in part on the second scenario;
   assigning a second simulation instance to the first category based at least in part on the second simulation data corresponding to the second simulation instance; and
   storing, at the first storage location, the second simulation instance and the second simulation data corresponding to the second simulation instance.

4. The system as recited in claim 1, the operations further comprising:
   prior to generating the simulation data:
      identifying a window of time associated with generating the simulation data;
      determining that a current or planned load on a computing resource during the window of time is below a threshold; and
      scheduling the generation of the simulation data to be performed during the window of time.

5. The system as recited in claim 1, the operations further comprising:
   receiving map data associated with a portion of the environment,
   wherein generating the scenario further comprises:
      including, in the scenario and at a location in accordance with the map data, an object not indicated in the log data.

6. The system as recited in claim 1, the operations further comprising:
   providing, to a user device, a notification indicating that the first simulation instance is assigned the first category.

7. A method comprising:
   obtaining scenario data, the scenario data representing a scenario for simulated testing of systems associated with a simulated vehicle in the scenario;
   generating a plurality of simulation instances based at least in part on the scenario data;
   assigning a first simulation instance of the plurality of simulation instances to a first category based at least in part on first simulation data indicating that execution of the first simulation instance indicates an engagement of an autonomous feature of the simulated vehicle;
   storing, at a first storage location, the first simulation instance and the first simulation data based at least in part on the first simulation instance being assigned the first category;
   assigning a second simulation instance of the plurality of simulation instances to a second category based at least in part on second simulation data corresponding to the second simulation instance indicating that the second simulation instance does not result in the engagement of the autonomous feature; and storing, at a second storage location different from the first storage location, the second simulation instance and the second simulation data based at least in part on the second simulation instance being assigned the second category.

8. The method as recited in claim 7, further comprising:
receiving log data associated with an autonomous vehicle, the log data representing an environment traversed by the autonomous vehicle, and
wherein obtaining the scenario comprises generating the scenario based at least in part on perturbing one or more values included in the log data.

9. The method as recited in claim 7, wherein the autonomous feature is one of:
a collision avoidance system associated with the simulated vehicle,
a lane monitoring system associated with the simulated vehicle, or
a fault detection system of the simulated vehicle.

10. The method as recited in claim 7, wherein assigning the first simulation instance to the first category is further based at least in part on an occurrence of a fault associated with the execution of the first simulation instance.

11. The method as recited in claim 7, further comprising:
assigning a third simulation instance of the plurality of simulation instances to a third category based at least in part on third simulation data corresponding to the third simulation instance; and
discarding the third simulation instance and the third simulation data based on the third simulation instance being assigned to the third category,
wherein:
the first category is a high priority, the second category is a mid-level category, and the third category is a low priority.

12. The method as recited in claim 7, wherein the scenario is a first scenario, the plurality of simulation instances is a first plurality of simulation instances, and the method further comprises:
generating second scenario data based at least in part on the first simulation data;
generating a second plurality of simulation instances based at least in part on the second scenario data;
assigning a second simulation instance of the second plurality of simulation instances to the first category based at least in part on second simulation data; and
storing, at the first storage location, the second simulation instance and the second simulation data based at least in part on the first category.

13. The method as recited in claim 7, further comprising:
determining that a current or planned load on a computing resource during a window of time is below a threshold; and
scheduling generation of the plurality of simulation instances to be performed during the window of time.

14. One or more non-transitory computer-readable media storing instructions that, when executed, cause one or more processors to perform operations comprising:
obtaining scenario data, the scenario data representing a scenario for simulated testing of systems associated with an autonomous vehicle;
generating, based at least in part on the scenario data, a plurality of simulation instances indicating autonomous operation of a simulated vehicle in the scenario;

assigning a first simulation instance of the plurality of simulation instances to a first category of a set of categories based at least in part on first simulation data indicating that the first simulation instance meets or exceeds a threshold indicative of autonomous operation of the simulated vehicle;
assigning a second simulation instance of the plurality of simulation instances to a second category of the set of categories, different from the first category;
storing the first simulation instance and the first simulation data at a first storage location based at least in part on the first simulation instance being assigned the first category;
storing the second simulation instance at a second storage location, different from the first storage location, based at least in part on the second simulation instance being assigned the second category; and
validating, using data stored at the first storage location, a system of the systems associated with the autonomous vehicle.

15. The one or more non-transitory computer-readable media as recited in claim 14, wherein the threshold indicative of autonomous operation of the simulated vehicle comprises an occurrence of an adverse event associated with the first simulation instance and assigning the first simulation instance to the first category is based at least in part on the occurrence of the adverse event.

16. The one or more non-transitory computer-readable media as recited in claim 15, wherein assigning the first simulation instance to the first category is based at least in part on determining the occurrence of the adverse event is at a fault of the simulated vehicle.

17. The one or more non-transitory computer-readable media as recited in claim 14, wherein the set of categories comprise: a high priority category, a review category and a low priority category.

18. The one or more non-transitory computer-readable media as recited in claim 14, wherein the scenario is a first scenario, the plurality of simulation instances is a first plurality of simulation instances, and wherein the operations further comprise:
generating second scenario data based at least in part on the first simulation data;
generating a second plurality of simulation instances based at least in part on the second scenario data;
assigning a simulation instance of the second plurality of simulation instances to the first category based at least in part on simulation data corresponding to the simulation instance indicating that the simulation instance meets or exceeds the threshold indicative of autonomous operation of the simulated vehicle; and
storing the simulation instance and the simulation data at the first storage location based at least in part on the simulation instance being assigned the first category.

19. The one or more non-transitory computer-readable media as recited in claim 14, wherein the operations further comprise:
determining that a current or planned load on a computing resource during a window of time is below a threshold; and
scheduling generation of the plurality of simulation instances to be performed during the window of time.

20. The one or more non-transitory computer-readable media as recited in claim 14, wherein the threshold is associated with one of:
engagement of a collision avoidance system associated with the simulated vehicle, a lane monitoring system associated with the simulated vehicle, or a fault detection system of the simulated vehicle.

\* \* \* \* \*